US012671425B2

(12) United States Patent
Rajasekhar et al.

(10) Patent No.: US 12,671,425 B2
(45) Date of Patent: Jun. 30, 2026

(54) HIGH SPEED PRECISION FRONTEND

(71) Applicant: Analog Devices International Unlimited Company, County Limerick (IE)

(72) Inventors: Sanjay Rajasekhar, Swindon (GB); Christopher Peter Hurrell, Cookham (GB); Andrew Joseph Thomas, Arlington, MA (US)

(73) Assignee: ANALOG DEVICES INTERNATIONAL UNLIMITED COMPANY, Co. Limerick (IE)

( * ) Notice: Subject to any disclaimer, the term of this patent is extended or adjusted under 35 U.S.C. 154(b) by 90 days.

(21) Appl. No.: 18/613,752

(22) Filed: Mar. 22, 2024

(65) Prior Publication Data

US 2025/0300665 A1 Sep. 25, 2025

(51) Int. Cl.
    H03M 1/06 (2006.01)

(52) U.S. Cl.
    CPC .................................. H03M 1/0604 (2013.01)

(58) Field of Classification Search
    CPC .......................... H03M 1/0604; H03M 1/0607
    USPC .......................................... 341/118, 120, 155
    See application file for complete search history.

(56) References Cited

U.S. PATENT DOCUMENTS

| | | |
|---|---|---|
| 5,838,598 A | 11/1998 | Hurrell |
| 6,707,403 B1 | 3/2004 | Hurrell |
| 6,828,927 B1 | 12/2004 | Hurrell et al. |
| 7,038,609 B1 | 5/2006 | Hurrell |
| 7,218,259 B2 | 5/2007 | Hurrell et al. |
| 7,250,880 B2 | 7/2007 | Hurrell et al. |
| 7,274,321 B2 | 9/2007 | Hurrell et al. |
| 7,286,075 B2 | 10/2007 | Hennessy et al. |
| 7,589,659 B2 | 9/2009 | Hurrell |
| 7,605,741 B2 | 10/2009 | Hurrell |
| 7,663,518 B2 | 2/2010 | Hurrell |
| 7,701,256 B2 | 4/2010 | Hurrell et al. |
| 7,773,020 B2 | 8/2010 | Hurrell |
| 7,924,203 B2 | 4/2011 | Hurrell |
| 7,936,297 B2 | 5/2011 | Hurrell et al. |
| 7,944,386 B2 | 5/2011 | Hurrell et al. |
| 8,040,264 B2 | 10/2011 | Hummerston et al. |
| 8,217,703 B2 | 7/2012 | Hurrell |
| 8,552,897 B1 | 10/2013 | Hurrell |
| 8,576,002 B2 | 11/2013 | Rajasekhar |
| 8,779,958 B1 | 7/2014 | Maurino et al. |
| 8,816,887 B2 | 8/2014 | Hurrell et al. |
| 8,975,953 B2 | 3/2015 | Meehan et al. |
| 8,994,564 B2 | 3/2015 | Hurrell et al. |
| 9,065,463 B2 | 6/2015 | Rajasekhar |
| 9,065,477 B2 | 6/2015 | Rajasekhar et al. |
| 9,191,023 B2 | 11/2015 | Hurrell |
| 9,231,539 B2 | 1/2016 | Lyden et al. |
| 9,294,037 B2 | 3/2016 | Maurino et al. |

(Continued)

*Primary Examiner* — Peguy Jean Pierre

(74) *Attorney, Agent, or Firm* — Knobbe, Martens, Olson & Bear, LLP

(57) ABSTRACT

The present disclosure provides a circuit which may be a drive system for an analog-to-digital converter (ADC), wherein the circuit measures the error from an amplifier within an auxiliary path and feeds-forward the error for correction in a main amplifier path. This results in a system with an output where the amplifier errors are removed from the output signal, thus, improving the overall system performance.

22 Claims, 5 Drawing Sheets

(56)                    References Cited

U.S. PATENT DOCUMENTS

| | | | |
|---|---|---|---|
| 9,391,628 B1 | 7/2016 | Lyden et al. | |
| 9,503,055 B2 | 11/2016 | Meehan et al. | |
| 9,525,409 B2 | 12/2016 | Hurrell et al. | |
| 9,800,262 B1 | 10/2017 | Maurino et al. | |
| 9,859,907 B1 * | 1/2018 | Li | H03M 1/0678 |
| 10,020,068 B2 | 7/2018 | Hurrell et al. | |
| 10,110,206 B2 | 10/2018 | Hummerston et al. | |
| 10,128,859 B1 | 11/2018 | Rajasekhar et al. | |
| 10,333,543 B1 | 6/2019 | Hurrell et al. | |
| 10,409,312 B1 | 9/2019 | Rajasekhar | |
| 10,505,561 B2 | 12/2019 | Bodnar et al. | |
| 10,511,316 B2 | 12/2019 | Bodnar et al. | |
| 10,516,408 B2 | 12/2019 | Bodnar et al. | |
| 10,541,604 B2 | 1/2020 | Hurrell et al. | |
| 10,541,702 B1 | 1/2020 | Bodnar et al. | |
| 10,707,889 B1 | 7/2020 | Bodnar et al. | |
| 10,715,160 B1 | 7/2020 | Rajasekhar et al. | |
| 10,733,391 B1 | 8/2020 | Sánchez Castro et al. | |
| 10,826,519 B1 | 11/2020 | Hurrell et al. | |
| 10,931,122 B2 | 2/2021 | Hurrell et al. | |
| 11,082,056 B2 | 8/2021 | Bodnar et al. | |
| 11,190,197 B2 | 11/2021 | Rajasekhar et al. | |
| 11,545,996 B1 | 1/2023 | Maurino et al. | |
| 11,689,166 B2 | 6/2023 | Hurrell | |
| 2010/0277231 A1 | 11/2010 | Hurrell et al. | |
| 2012/0007660 A1 | 1/2012 | Hummerston et al. | |
| 2022/0136866 A1 * | 5/2022 | Takai | G01D 5/2448 |
| | | | 324/207.12 |

* cited by examiner

HIGH SPEED PRECISION FRONTEND

TECHNICAL FIELD

The present disclosure generally relates to systems and circuits for use with analog-to-digital converters (ADC) or the like, particularly in relation to systems and circuits comprising a full differential amplifier (FDA).

BACKGROUND AND RELATED ART

Traditional analog frontend architectures typically comprise of an FDA driving an ADC. On its own the FDA usually produces noise and signal distortion, which cause problems for output accuracy and overall system performance. This problem is particularly acute when signals are higher frequency and the ADCs are higher throughput.

SUMMARY OF THE DISCLOSURE

Embodiments of the present disclosure provide an analog frontend architecture that provides easy input drive, low noise, low distortion, high DC accuracy; and providing all of these with high power efficiency.

The present disclosure provides a circuit which may be a drive system for an ADC, wherein the circuit measures the error from an amplifier within an auxiliary path and feeds-forward the error for correction in a main amplifier path. This results in a system with an output where the amplifier errors are removed from the output signal, thus, improving the overall system performance.

In embodiments of the present disclosure, the circuit may include two signal pathways such as an input signal path and a feed-forward signal path. The input signal path will comprise an input amplifier arranged to receive the input signal, however, said input amplifier will introduce an error voltage into the circuit. The input amplifier may be an FDA. The feed-forward signal path will convey the error voltage introduced by the input amplifier as part of an error signal. The feed-forward signal path may comprise a feed-forward active component such as an operational amplifier. The circuit will further comprise error cancellation circuitry that is arranged to operate on the input signal and the error signal to cancel the error voltage Ve from the input signal. Therefore, the output of the circuit may be digitized wherein the digitization will not include the error voltage.

The input amplifier may be further arranged to receive an input signal to be digitized. The error cancellation circuitry may be arranged such that the digitized input signal has the error voltage Ve cancelled therefrom.

In other embodiments of the present disclosure, the error cancellation circuitry implemented within the circuit may operate on the input signal on the main ADC channel and may operate on the error signal within a feed-forward ADC channel. Thus, the error cancellation circuitry may comprise two ADCs, such that the input signal and the error signal may be separately digitized at a main ADC and feed-forward ADC respectively. The two digital signals may then be combined to cancel the error voltage.

In other embodiments of the present disclosure, the error cancellation circuitry implemented within the drive circuit may operate on the input signal on the main ADC channel and operate on the error signal within a feed-forward ADC channel. In this embodiment, the main ADC channel and the feed-forward ADC channel may be channels of the same ADC i.e., a two channel ADC. Thus, both the input signal and the error signal may be digitized together within the same ADC signal to produce a single digitized output such that the digitized output has the error voltage Ve cancelled.

A first aspect of the present disclosure provides a circuit, the circuit comprising one or more of: an input amplifier arranged to receive an input signal, the input amplifier introducing into the input signal an error voltage Ve; and a feed-forward signal path being arranged such that it conveys an error signal representative of the error voltage Ve; and error cancellation circuitry arranged to operate on the input signal and the error signal to cancel the error voltage Ve from the input signal.

The input amplifier may be arranged to receive an input signal to be digitized. The error cancellation is arranged such that the digitized input signal has the error voltage Ve cancelled therefrom.

The feed-forward signal path may comprise at least one feed-forward active component.

The circuit may further comprise an input impedance network which may be coupled to an input and an output of the input amplifier where an output of the impedance network forms part of the feed-forward signal path, the impedance network may be comprised of a potential divider.

The input amplifier may be further arranged such that the input signal including the error voltage Ve is fed to a main ADC for digitization.

The feed-forward signal path may comprise a feed-forward analog-to-digital converter (ADC) channel.

The error cancellation circuitry may operate on the input signal that includes the error voltage Ve on a main ADC channel and the error signal on a feed-forward ADC channel and may be further arranged to separately digitize: (i) the input signal via a main ADC; and (ii) the error signal via a feed-forward ADC; and combines a digital representation of the error signal from the feed-forward ADC with a digital representation of the input signal from the main ADC, for use in cancelling the error Voltage Ve contained therein.

The at least one feed-forward active component may be an operational amplifier.

A multiplier may be positioned in the feed-forward signal path, the multiplier may be arranged to scale and/or invert the signal from an ADC, prior to being applied to the error cancellation circuitry. On the other hand, the multiplier may be positioned on the output of the drive circuit, the multiplier being arranged to scale and/or invert the output from the drive circuit, prior to being applied to the error cancellation circuitry.

The error cancellation circuitry may operate on the input signal on a main ADC channel and the error signal on a feed-forward ADC channel, the main ADC channel and the feed-forward ADC channel may be channels of a two channel main ADC, the two channel main ADC digitizes a combined input signal and error signal to produce a single digitized output such that the digitized output has the error voltage Ve cancelled therefrom.

The two channel main ADC may comprise a first channel and a second channel, the first channel may comprise: a first switch and a first capacitor in series, the second channel may comprise: a second switch and a second capacitor in series, wherein the first switch of the first channel of the two channel main ADC may be used to sample and hold the input signal including the error Ve on the first capacitor, the second switch may be used to sample and hold the error signal on the second capacitor.

The first channel and second channel of the two channel main ADC may be arranged such that when the combined input signal is acquired on the first capacitor and the error signal is acquired on the second capacitor the two channel main ADC digitizes the combined input signal and the error signal to produce the digitized output. The capacitance of the first capacitor in the first channel and the capacitance of the second capacitor in the second channel may be scaled to cancel the error voltage Ve in the two channel main ADC.

The feed-forward signal path may further comprise a third capacitor, the third capacitor may be arranged to sample the error signal prior to gain in the feed-forward signal path.

The drive circuit may be arranged such that a bandwidth of the drive circuit first sampling the input signal and a bandwidth of the drive circuit first sampling the error signal are substantially matched, and wherein the first sampling of the input signal including the error Ve and the first sampling of the error signal may occur at substantially the same time.

The error cancellation circuitry may comprise a first resistor in an input signal path and a second resistor in an error signal path, the first resistor and the second resistor both may be connected to an output node and may be arranged such that the error voltage Ve is cancelled from the input signal by the overall ratio of the network resistances at the output node.

A further aspect of the present disclosure provides a circuit which may be for a main analog-to-digital converter (ADC), the circuit comprising one or more of: an input amplifier arranged to receive and amplify an input signal to be digitized by a main ADC channel, the input amplifier introducing into the input signal an error voltage Ve, the input signal including the error voltage Ve being input into the main ADC channel for digitization; and a feed-forward signal path comprising a feed-forward analog-to-digital converter (ADC) channel that receives an error signal representative of the error voltage Ve for digitization; and error cancellation circuitry arranged to operate on the signals on the main ADC channel and the feed-forward ADC channel, the main ADC channel and the feed-forward ADC channel being channels of a main ADC, the main ADC digitizes the input signal and the error signal to produce a digitized output such that the digitized output has the error voltage Ve cancelled therefrom.

The two channel ADC channel comprises a first channel or main ADC channel and a second channel or feed-forward ADC channel. The first channel may comprise one or more of: a first switch, a first capacitor and a second switch arranged in series, the second channel may comprise one or more of: a third switch, a second capacitor and a fourth switch arranged in series, wherein the first switch of the first channel of the two channel main ADC may be used to sample and hold the input signal on the first capacitor, the third switch of the second channel may be used to sample and hold the error signal on the second capacitor. The feed-forward signal path may further comprise a third capacitor, the third capacitor may be arranged to sample the error signal prior to gain in the feed-forward signal path, and wherein the voltage on the first capacitor of the first channel of the two channel main ADC and the voltage on the third capacitor in the feed-forward signal path are acquired during a first time period.

The drive circuit may be arranged such that the error signal is acquired on the feed-forward ADC channel during a second time period and such that the two channel main ADC may digitize the input signal and the error signal to produce a digitized output during a third time period, wherein the third time period occurs after the second time period and the second time period occurs after the first time period.

A further aspect of the present disclosure provides a circuit which may be for a main analog-to-digital converter (ADC), the circuit comprising one or more of: an input amplifier arranged to receive and amplify an input signal to be digitized by a main ADC channel, the input amplifier introducing into the input signal an error voltage Ve, the input signal including the error voltage Ve being input into the main ADC channel for digitization; and a feed-forward signal path comprising a feed-forward analog-to-digital converter (ADC) channel that receives an error signal representative of the error voltage Ve for digitization; and error cancellation circuitry arranged to operate on the signals on the main ADC channel and the feed-forward ADC channel, and further arranged to separately digitize: (i) the input signal via a main ADC; and (ii) the error signal via a feed-forward ADC; and combines a digital representation of the error signal with a digital representation of the input signal to cancel the error Voltage Ve contained therein.

The drive circuit may be arranged such that the input signal is acquired at the main ADC and the error signal is acquired, on a capacitor arranged in the feed-forward signal path, during a first sample time; and wherein during a second sample time, the error signal may be acquired at the feed-forward ADC and the main ADC digitizes the input signal, wherein the second sample time occurs after the first sample time.

The drive circuit may be further arranged such that the error signal is digitized by the feed-forward ADC during a third sample time, wherein the third sample time occurs after the second sample time.

Further features and advantages will be apparent from the appended claims.

BRIEF DESCRIPTION OF THE DRAWINGS

Further features and advantages of the present disclosure will become apparent from the following description of an embodiment thereof, presented by way of example only, and with reference to the accompanying drawings, wherein like reference numerals refer to like part.

DETAILED DESCRIPTION OF THE PREFERRED EMBODIMENTS

Figure 1:
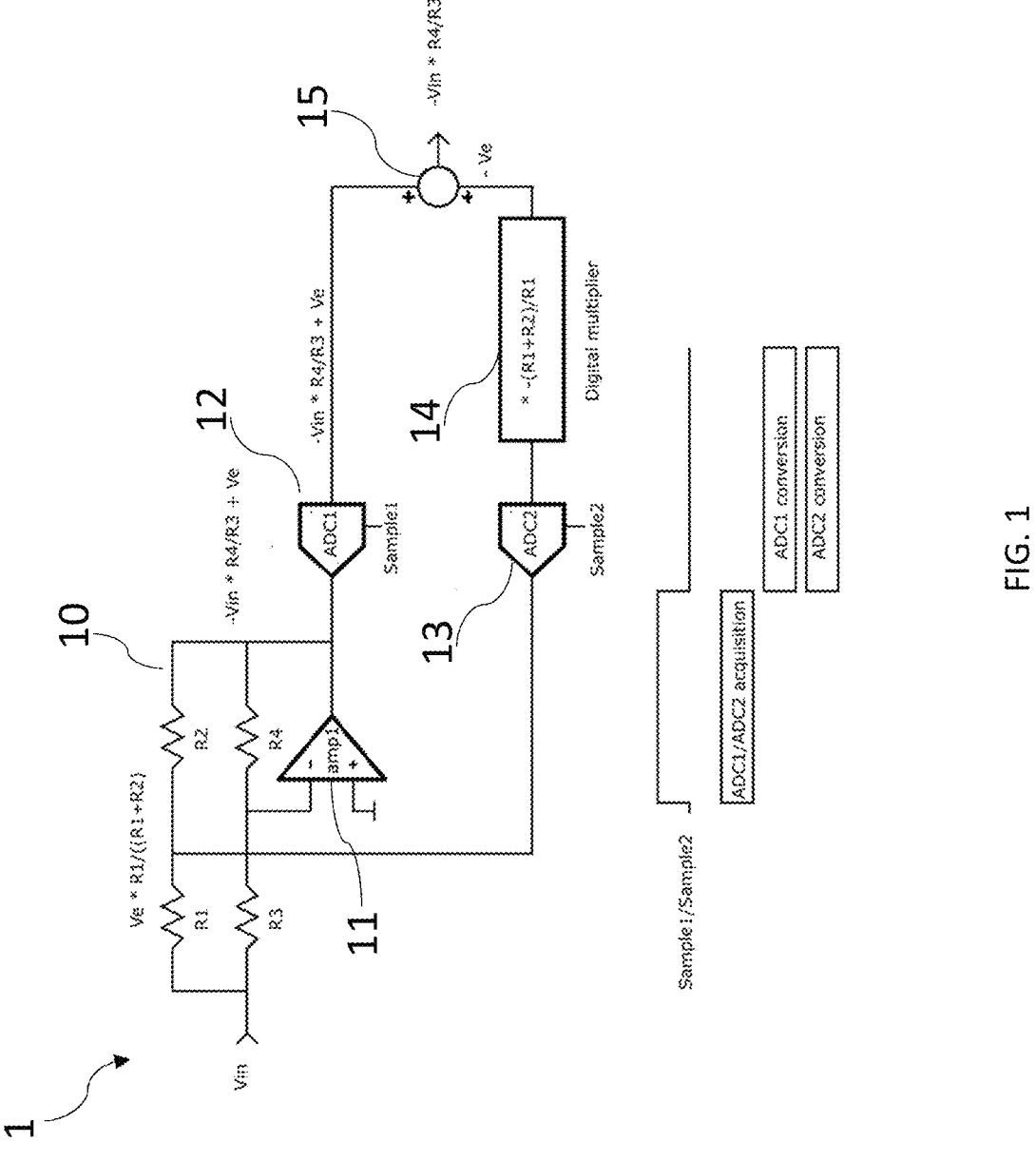
FIG. 1 shows a schematic diagram of a circuit utilizing a dual ADC arrangement, in accordance with an embodiment of the present disclosure.

A signal chain typically has a few shortcomings in the context of FDAs implemented in CMOS processes (for say, monolithic integration with ADCs). The shortcomings may include:

offsets and flicker noise coming from the FDA;

The amplifier generally doesn't have much loop gain in the 10 s of MHz input frequencies. This leads to distortion of the signal;

The resistors around the amplifier will need to be small if the noise performance is important. This also adds to signal distortion;

The ADC normally presents a nonlinear load to the FDA-both in terms of continuous time nonlinear capacitance and periodic nonlinear glitches due to sampling. This places constraints on the filter between the ADC and the FDA and has implications for noise filtering and distortion.

Therefore, there is a need to develop a system in the context of FDAs in CMOS processes (more particularly in the context of throughput ADCs utilizing higher frequencies), that have improved overall system performance i.e., reducing the levels of offset, signal flicker, signal distortion, glitching, signal constraints etc. Specifically, there is a need for an ADC drive circuit with the aforementioned improvements.

The present disclosure relates to systems and circuits in the context of FDAs in CMOS processes wherein the related signals are of higher frequency and the ADCs are higher throughput. In one aspect, the present disclosure seeks to solve the problem of the amplifier introducing error voltage into the signal; as well as reducing circuit offset, flicker noise, signal distortion, glitching etc.

The present disclosure provides a circuit which may be for an ADC, wherein the circuit comprises of two signal pathways: namely, the input signal path and the feed-forward signal path. The input signal is introduced into the input of an input amplifier which is arranged to receive the input signal which may ultimately be digitized, where an amplification gain factor can be greater, equal or less than 1. However, during amplification the input amplifier introduces an error voltage, Ve, into the input signal path. The feed-forward signal path may comprise one or more feed-forward active components which are arranged to convey an error signal, containing the error voltage Ve, for digitization. The drive circuit further comprises error cancellation circuitry, which is arranged to cancel the error voltage, Ve, from within the circuit. Specifically, the error cancellation circuitry is arranged to operate on the input signal and the error signal to cancel the error voltage Ve from the input signal such that the digitized input signal has the error voltage Ve cancelled.

More particularly, a further embodiment of the present disclosure relates to a circuit, wherein the circuit comprises of two signal pathways: namely, the input signal path and the feed-forward signal path. The input signal is introduced into the input of an input amplifier which is arranged to receive the input signal which may be ultimately to be digitized. The input amplifier is further arranged such that the input signal being input into a main ADC channel for digitization. The input amplifier may also allow for attenuation of the signal, buffering, level shifting etc. However, during amplification the input amplifier introduces an error voltage, Ve, into the input signal path. The feed-forward signal path may comprise one or more feed-forward active components which are arranged to convey an error signal, containing the error voltage Ve, for digitization. Moreover, the feed-forward signal path further comprises a feed-forward analog-to-digital converter (ADC) channel. The drive circuit further comprises error cancellation circuitry, which is arranged to cancel the error voltage, Ve, from within the circuit. The error cancellation circuitry is arranged to operate on the input signal and the error signal to cancel the error voltage Ve from the input signal such that the digitized input signal has the error voltage Ve cancelled. Specifically, the error cancellation circuitry operates on the input signal on the main ADC channel and the error signal on the feed-forward ADC channel and further arranged to separately digitize: (i) the input signal via a main ADC; and (ii) the error signal via a feed-forward ADC; and then combine the digital representation of the error signal with the output of the main ADC to cancel the error Voltage Ve.

More particularly, a further embodiment of the present disclosure relates to a circuit which may be for an ADC and may be a drive circuit for said ADC, wherein the circuit comprises of two signal pathways: namely, the input signal path and the feed-forward signal path. The input signal is introduced into the input of an input amplifier which is arranged to amplify the input signal which is ultimately to be digitized. The input amplifier is further arranged such that the input signal is input into a main ADC channel for digitization. However, during amplification the input amplifier introduces an error voltage, Ve, into the input signal path. The feed-forward signal path being arranged such that is conveys an error signal, containing the error voltage Ve, for digitization. Moreover, the feed-forward signal path further comprises a feed-forward analog-to-digital converter (ADC) channel. The drive circuit further comprises error cancellation circuitry, which is arranged to cancel the error voltage, Ve, from within the circuit. The error cancellation circuitry is arranged to operate on the input signal and the error signal to cancel the error voltage Ve from the input signal such that the digitized input signal has the error voltage Ve cancelled. Specifically, the error cancellation circuitry operates on the input signal on the main ADC channel and the error signal on the feed-forward ADC channel. In this arrangement, the main ADC channel and the feed-forward ADC channel are channels of the same ADC i.e., a two-channel main ADC. In this regard, the input signal and the error signal are combined and digitized together within the two-channel main ADC. The two-channel main ADC produces a digitized output, where the digitized output has the error voltage Ve cancelled.

The present disclosure will now be discussed in more detail in relation to the associated FIGS. 1 to 5. The present disclosure relates to a circuit and method of operating said circuit. In relation to FIGS. 1 to 5, the circuit is described as an ADC driver circuit, however, the circuit is not limited to use purely as a driver or in relation to ADCs. The ADC driver circuit is discussed as an example.

Firstly, FIG. 1 shows a schematic diagram of an ADC driver circuit 1 utilizing a dual ADC arrangement, in accordance with an embodiment of the present disclosure. However, the circuit is not limited to an ADC driver circuit and may also be considered a conversion signal chain circuit, for example. FIG. 1 shows an ADC driver circuit 1 (or conversion signal chain circuit), comprising an input resistor network 10, an input amplifier 11, a main ADC 12, a feed-forward ADC 13, a digital multiplier 14 and a summation block 15. The input resistor network 10, the input amplifier 11 and the main ADC 12 make up the input signal path. The feed-forward ADC 13 and the digital multiplier 14 make up the feed-forward signal path. The outputs of the input signal path and the feed-forward signal path feed into the summation block 15.

In this embodiment of the present disclosure an error voltage, Ve, is introduced by the input amplifier 11. The error voltage, Ve, is therefore present on the output of the input amplifier 11 and includes the following:

Offset and 1/F noise at the input of the input amplifier 11 multiplied by (1+R4/R3);

Gain error due to finite amplifier gain;

Distortion introduced by the input amplifier 11; and

Wideband noise introduced by the input amplifier 11 and resistors R3 and R4.

The ADC driver circuit 1 is arranged such that the error voltage, Ve, introduced by the input amplifier 11, is present in both the input signal path and the feed-forward signal path. The input resistor network 10 sets the gain of the input amplifier 11 but also ensures that the error voltage, Ve, is present in both the input signal path and the feed-forward signal path. Thus, the input signal (including the error voltage, Ve) is digitized by the main ADC 12, to create a digital representation of the input signal including the error voltage, Ve. An error signal representative of the error voltage, Ve, is digitized by the feed-forward ADC 13 within the feed-forward signal path. This produces a digitized version of the error signal representation. The digital multiplier 14 then multiplies the digitized error signal to invert it and remove the effect of the input resistor network 10, to leave just the voltage error, –Ve. The digitized input signal (including the error voltage, Ve) is combined with the inverted error voltage, Ve, at the summation block 15. Therefore, the summation block 15 completes the following summation:

Digital Output=(Digitized Input Signal+Error Voltage)+(Feed-forward Error Voltage)

Digital Output=((–Vin*$R4/R3$)+$Ve$)+($–Ve$)

Digital Output=–Vin*$R4/R3$

Therefore, it can be seen that the error voltage, Ve, that is introduced by the input amplifier 11 is not present in the digitized output from the summation block 15. Thus, this embodiment of the present disclosure has improved overall performance as it reduces the offset, noise, gain error, distortion, wideband noise etc at the output of the circuit.

It is worth noting that, when R2/R1=R4/R3, then the feed-forward ADC 13 input contains no Vin component (to first order).

Ultimately, the output of the input signal path and the output of the feed-forward signal path are combined to reduce or remove the error voltage, Ve, from the overall digitized output.

Additionally, FIG. 1 incorporates an accompanying timing diagram. The timing diagram shows the relative operation and timings of different aspects of the ADC driver circuit 10. In this scenario, the timing diagram shows that the signal acquisition at the main ADC 12 and the feed-forward ADC 13 occur first and at the same time. Following the signal acquisition, the signals conversion by the main ADC 12 and the feed-forward ADC 13 are initiated at the same time.

Figure 2:
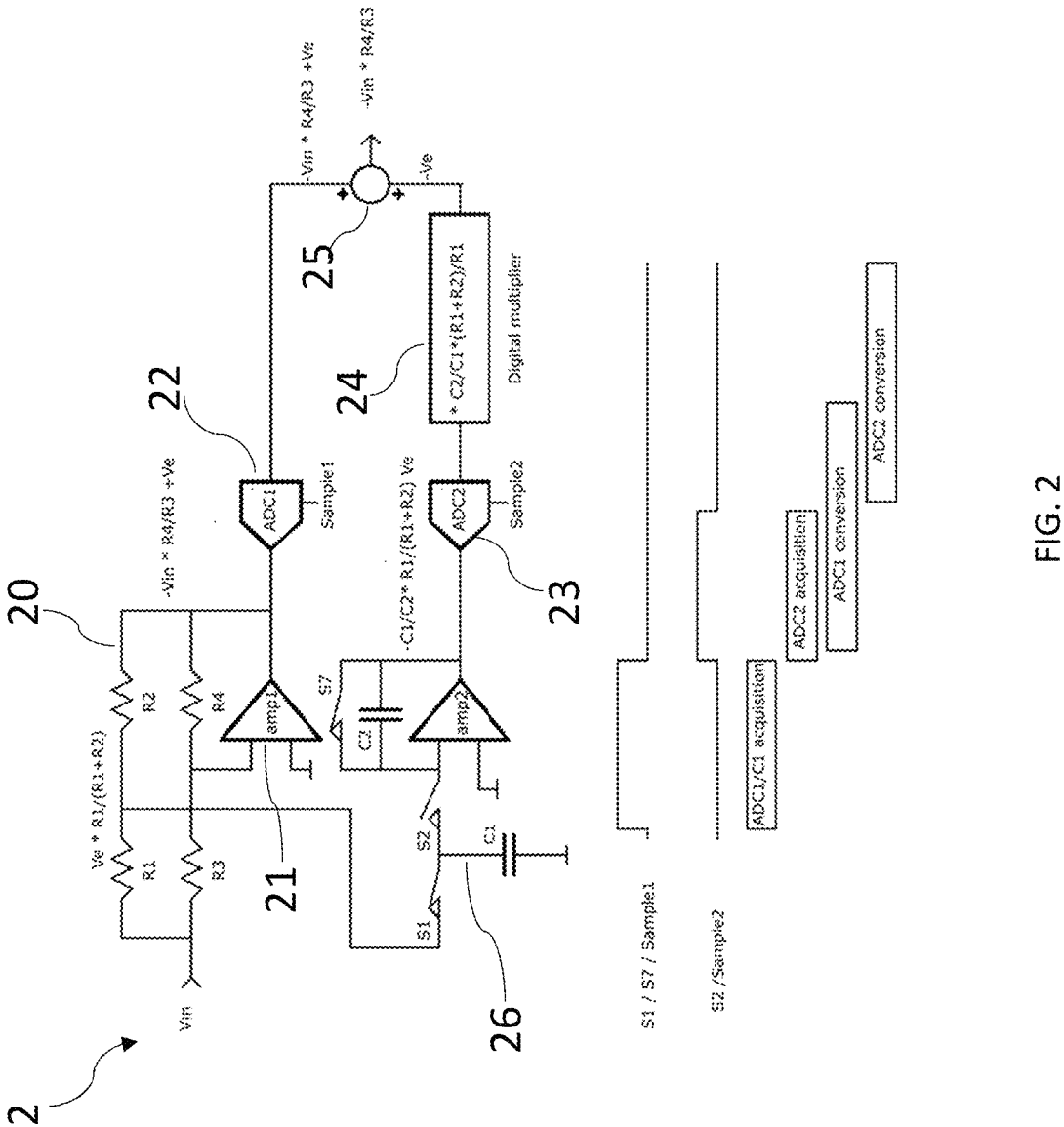
FIG. 2 shows a schematic diagram of a circuit utilizing a dual ADC arrangement with an active feed-forward component, in accordance with a further embodiment of the present disclosure.

FIG. 2 shows a schematic diagram of an ADC driver circuit utilizing a dual ADC arrangement with an active feed-forward component, in accordance with a further embodiment of the present disclosure. FIG. 2 shows an ADC driver circuit 2 comprising an input resistor network 20, an input amplifier 21, a main ADC 22, a feed-forward ADC 23, a digital multiplier 24 and a summation block 25. The arrangement displayed in FIG. 2 is much like that of FIG. 1, however, FIG. 1 differs in that it further includes a feed-forward active component 26 which may be an operational amplifier arrangement 26, for example an inverting amplifier 26. The inverting amplifier 26 may comprise of a series of switches, capacitors, resistors, operational amplifiers etc. The input resistors R3 and R4 of network 20, the input amplifier 21 and the main ADC 22 make up the input signal path. The input resistors R1 and R2 of network 20, the inverting amplifier 26, the feed-forward ADC 23 and the digital multiplier 24 make up the feed-forward signal path. The outputs of the input signal path and the feed-forward signal path feed into the summation block 25.

Like in relation to FIG. 1, in FIG. 2 the ADC driver circuit 2 is arranged such that the error voltage, Ve, introduced by the input amplifier 21, is present in both the input signal path and the feed-forward signal path. The input resistor network 20 sets the gain of the input amplifier 21 but also ensures that the error voltage, Ve, is present in both input signal path and the feed-forward signal path. Thus, the input signal (including the error voltage, Ve) is digitized by the main ADC 22, to create a digital representation of the input signal including the error voltage, Ve. An error signal representative of the error voltage, Ve, is digitized by the feed-forward ADC 23 within the feed-forward signal path to produce a digitized version of the error signal representation. However, in the ADC driver circuit 2, the error signal representation is first passed through a feed-forward active component 26, in this example, an inverting amplifer 26. The inverting amplifier 26 applies gain to the error signal representation before being digitized by the feed-forward ADC 23. The digital multiplier 24 then multiples the digitized error signal to invert it and remove the effect of the input resistor network 20 and the feed-forward active component 26 (i.e., multiplied by C2/C1*(R1+R2)/R1)), to leave just the voltage error, Ve. The digitized input signal (including the error voltage, Ve) is combined with the inverted error voltage, Ve, at the summation block 25. Therefore, the summation block 25 completes the following summation:

Digital Output=(Digitized Input Signal+Error Voltage)+(Feed-forward Error Voltage)

Digital Output=((–Vin*$R4/R3$)+$Ve$)+($–Ve$)

Digital Output=–Vin*$R4/R3$

In the embodiment presented in relation to FIG. 1, the feed-forward ADC 13 noise is multiplied by (R1+R2)/R1 in the multiplier 14 before being summed with the output of the main ADC 12 at the summation block 15. To reduce the effect of the feed-forward ADC 23 noise in the embodiment in relation to FIG. 2, it is more efficient to apply a gain of (R1+R2)/R1 to the representative error signal before the feed-forward ADC 23.

Moreover, the feed-forward active component 26 can also be chopped or auto-zeroed to suppress its own 1/F noise and offset.

Additionally, FIG. 2 incorporates an accompanying timing diagram. The timing diagram shows the relative operation and timings of different aspects of the ADC driver circuit 20. The timing diagram shows that initially S1 and S7 are closed, which coincides with the signal acquisition on the main ADC 22. Next, S1 and S7 open and S2 closes which results in the voltage captured on C1 being amplified and acquired by the feed-forward ADC 23. At the same time, the main ADC 22 is converting the signal that was acquired. Once ADC 23 has acquired the voltage at the output feed-forward active component 26, feed-forward ADC 23 can begin converting the acquired signal.

Figure 3:
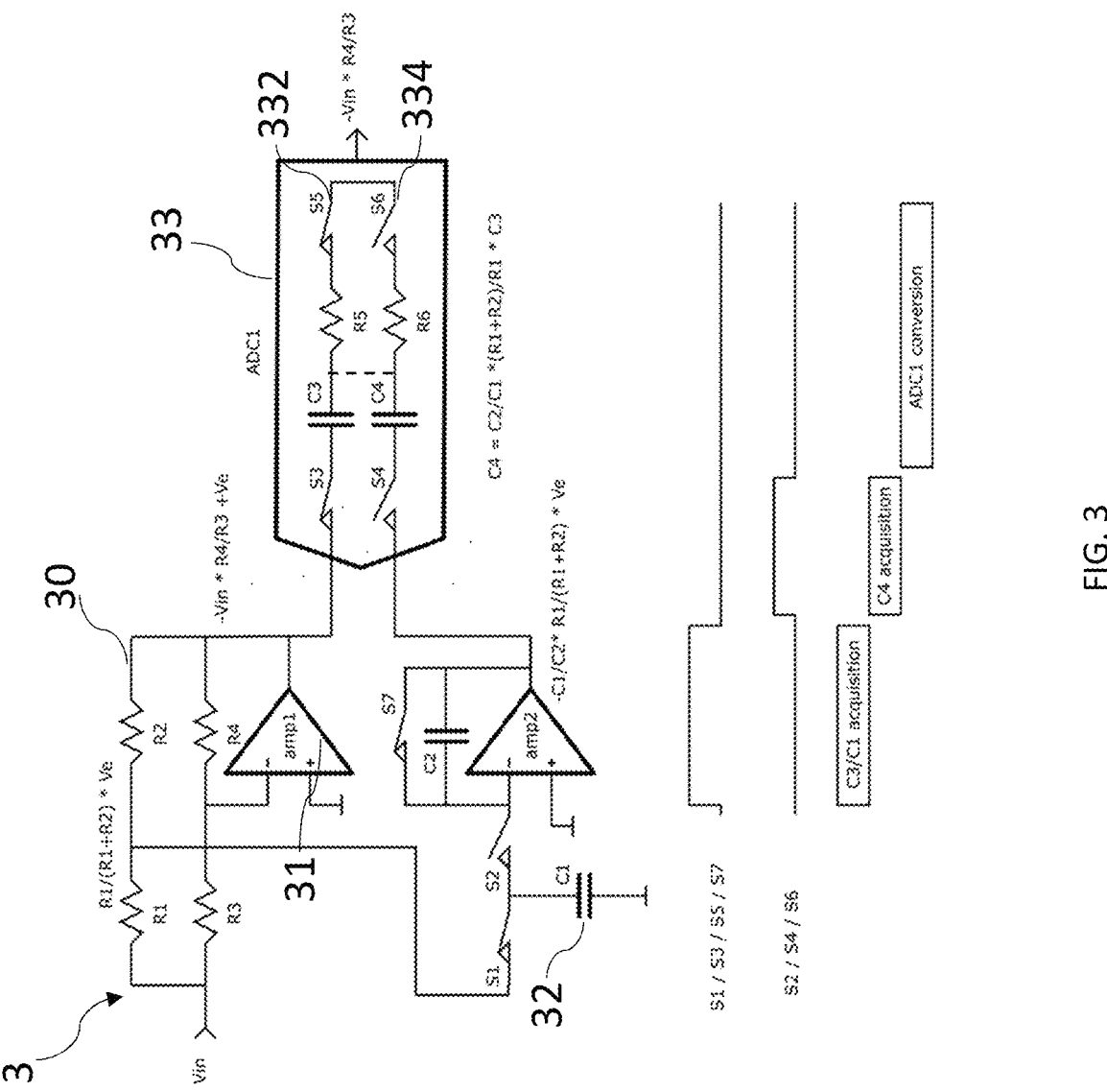
FIG. 3 shows a schematic diagram of a circuit utilizing a combined ADC arrangement, in accordance with a further embodiment of the present disclosure.

FIG. 3 shows a schematic diagram of an ADC driver circuit utilizing a combined ADC arrangement, in accordance with a further embodiment of the present disclosure. FIG. 3 shows an ADC driver circuit 3 comprising an input resistor network 30, an input amplifier 31, a feed-forward active component 32 for example an operational amplifier arrangement 32, which may be an inverting amplifier 32, and a two channel main ADC 33. The two channel main ADC 33 is formed of an input ADC channel 332 and a feed-forward ADC channel 334. The input resistors R3 and R4 of network 30, the input amplifier 31 and the input ADC channel 332 of the two-channel main ADC 33 make up the input signal path. The input resistors R1 and R2 of network 30, active feed-forward component 32 and the feed-forward channel 334 of the two-channel main ADC 33 make up the feed-forward signal path.

Further, as discussed, the two channel main ADC 33 comprises a first channel 332 and a second channel 334, the first channel 332 comprises: a first switch S3, a first capacitor C3, a first resistor R5 and a second switch S5 arranged in series, the second channel 334 comprising: a third switch S4, a second capacitor C4, a second resistor R6 and fourth switch S6 arranged in series. The first channel 332 of the two channel main ADC 33 and the second channel 334 of the two channel main ADC 33 are configured in a parallel arrangement. In this arrangement, the first S3 and second switch S5 of the first channel 332 of the two channel main ADC 33 are used to sample and hold the input signal on the first capacitor C3, the third S4 and fourth switch S6 are used to sample and hold the error signal on the second capacitor C4.

Like in relation to FIGS. 1 and 2, in FIG. 3 the ADC driver circuit 3 is arranged such that the error voltage, Ve, introduced by the input amplifier 31, is present in both the input signal path and the feed-forward signal path. The input resistor network 30 sets the gain of the input amplifier 31 but also ensures that the error voltage, Ve, is present in both input signal path and the feed-forward signal path. Moreover, the error signal representative of the error voltage, Ve, is passed through the feed-forward active component 32, for example an inverting amplifier 26, which amplifiers the representative error signal by a gain of –C1/C2. As previously mentioned, the output of the feed-forward active component 26 is then connected to the feed-forward channel 334 of the two-channel main ADC 33. The input signal path is connected to the input ADC channel 332 of the two-channel main ADC 33. Thus, the main difference between the embodiment of FIG. 3 and the embodiments of FIGS. 1 and 2, is that the ADC drive circuit 3 only comprises of one ADC, whereas the ADC drive circuits 1 and 2 have two separate ADCs.

In this regard, the input signal and the error signal are combined within and digitized together within the two-channel main ADC. (Note that only the switches required for acquiring the inputs are shown in ADC 33.)

The output of the feed-forward active component 32 is:

$$-(C1/C2)*(R1/(R1+R2))*Ve$$

With C4 set to:

$$C2/C1*(R1+R2/R1)*C3$$

the charge captured on C4 is the product of these two terms and is just –Ve*C3.

The output of the input amplifier 30 would be (–Vin*R4/R3)+Ve, which results in a charge being captured on C3 of:

$$((-Vin*R4/R3)+Ve)*C3$$

Combining the charges on C3 and C4 gives a net charge on the ADC sampling caps of:

$$(-Vin*R4/R3)*C3$$

where the –Ve term is cancelled.

As has been shown, if C3 and C4 are correctly scaled, then the digitized output will be the input signal without the error voltage, Ve:

$$Digitized\ Output=-Vin*R4/R3$$

Therefore, fundamentally the embodiment in relation to FIG. 3 shows that a single ADC 33 can be used if the sampling capacitor within the single ADC 33 are split into 2 capacitors C3 and C4, one which samples the input signal path and the other that samples the feed-forward compensation path and these two capacitors are combined during the ADC conversion process.

The third capacitor (otherwise referred to as C1), within the feed-forward signal path, is being used to sample the error signal prior to gain. This allows the gain to be performed on a DC sampled signal which can be done in a more power efficient way. Correct scaling between C3 and C4 would be required to ensure that Ve is correctly cancelled within the ADC. The downside of this approach is that the ADC operations may have to be delayed till the feed-forward amplifier has fully settled and the ADC driver circuit may be slower than dual ADC arrangements, such as in FIGS. 1 and 2. However, since the error Ve can be very small, it may be possible to start the ADC with the voltage captured on C3 and then complete the conversion with the contribution from C4 after S4 has opened. Redundancy within the ADC may have to be used in this case.

Additionally, FIG. 3 incorporates an accompanying timing diagram. The timing diagram shows the relative operation and timings of different aspects of the ADC driver circuit 30. Initially, whilst S1, S3, S5 and S7 are all closed and S2 is open, signals will be acquired on C3 i.e., of the input ADC channel 332 of the two-channel main ADC 33 and on C1 i.e., a component of the feed-forward active component 32. Next, when S1, S3, S5 and S7 open, signals will be captured on C3 and C1 and with S2, S4 and S6 close, the signal will start being acquired on C4 i.e., the feed-forward ADC channel 334 of the two-channel main ADC 33. After a delay for the feed-forward active component to settle S4 and S6 open and the –Ve term will be captured on C4. Finally, at this point the signals have been captured on both the input ADC channel 332 and feed-forward ADC channel 334 of the two-channel main ADC 33, and therefore, conversion of the acquired signals occurs.

It is highly advantageous to have the bandwidth of the sample circuit acquiring the input signal and the sample circuit acquiring the error signal matched. The error voltage Ve includes the wideband thermal noise from the amplifier 31 and gain resistors R3 and R4. The sampling bandwidth of the input signal including Ve is substantially set by C3 and R5. As the error Ve is captured on C3 with a certain bandwidth, it can be arranged that the measure of Ve also be captured with the same bandwidth on C1. This would mean that not only the DC errors and distortion from the amplifier 31 and R3 and R4 are cancelled, but it would also mean that the wideband noise from the amplifier 31 and R3 and R4 is also cancelled. This is very advantageous as the noise and distortion of amplifier 31 is inconsequential, which yields a very power efficient design.

$$The\ bandwidth\ of\ the\ main\ sampling\ path=1/(2\varpi*R5*C3)$$

$$The\ bandwidth\ of\ the\ feedforward\ path=1/(2\varpi*(R1*R2/(R1+R2))*C1)$$

R1, R2, R5, C1 and C3 are chosen to have these two bandwidths matched.

During the conversion phase of ADC1, the converter operates on the total charge sampled on to C3 and C4. It is only the sampling of two separate inputs on to two separate capacitors that is unusual in this ADC. Various ADC architectures can be used to convert the total charge on C3 and C4, for example a SAR converter or a pipeline converter. For the ADC to operate on the total sampled charge on C3 and C4 these two capacitors will need to be merged, for example by shorting the right-hand side nodes of C3 and C4 with a switch (not shown) during the conversion process (The merged nodes are shown with a dotted line). It is expected that, as with many ADCs, the sampling capacitors are sub-divided into binary scaled capacitors which are switched by reference switches (not shown) to a reference voltage or ground during the conversion process. The final digital result is the weighted sum of the capacitors switched to the reference voltage at the end of the conversion. Alternative arrangements use a separate DAC to perform all or part of the conversion with C3 and/or C4 just acting as sampling capacitors.

Figure 4:
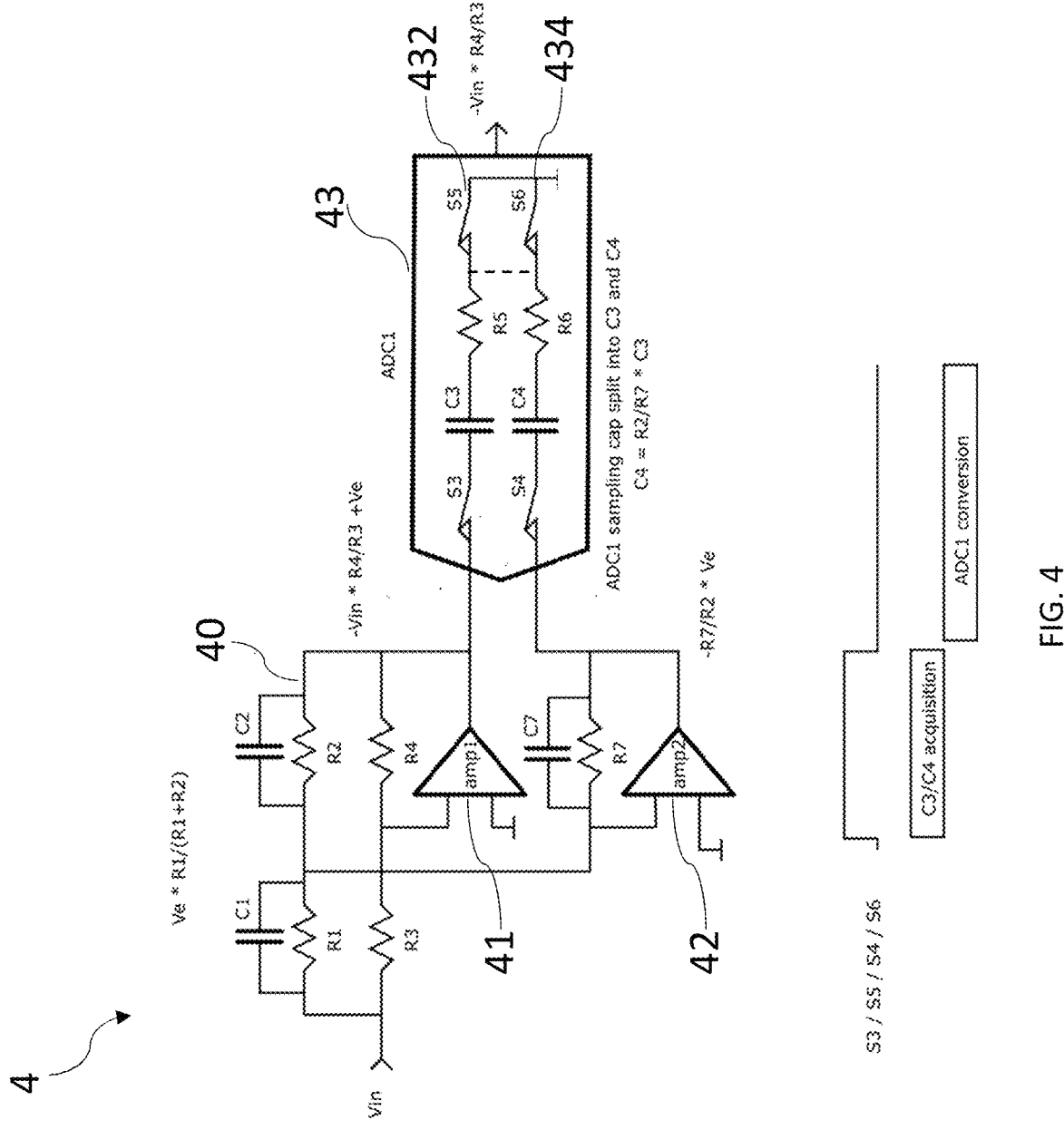
FIG. 4 shows a schematic diagram of a circuit utilizing a combined ADC and RC input circuit arrangement, in accordance with a further embodiment of the present disclosure.

FIG. 4 shows a schematic diagram of an ADC driver circuit utilizing a combined ADC and RC input circuit arrangement, in accordance with a further embodiment of the present disclosure. FIG. 4 shows an ADC driver circuit 4 comprising an input resistor-capacitor (RC) network 40, an input amplifier 41, a feed-forward active component 42 and a two-channel main ADC 43. The two-channel main ADC 43 comprising an input ADC channel 432 and a feed-forward ADC channel 434. R3 and R4 of input RC network 40, the input amplifier 41 and the input ADC channel 432 of the two-channel main ADC 43 make up the input signal path. R1, R2, C1 and C2 of input RC network 40, the active feed-forward component 42 and the feed-forward ADC channel 434 of the two-channel main ADC 43 make up the feed-forward signal path.

The embodiment as presented in FIG. 4 is similar to that as presented in relation to FIG. 3, particularly in that it also has a two-channel main ADC 43. However, the embodiment in relation to FIG. 4 differs in that it comprises an input RC network 40 rather than an input resistor network, and the feed-forward active component 42 comprises both resistors and capacitors rather than just capacitors. Moreover, the input ADC channel 432 and the feed-forward ADC channel 434 of the two-channel main ADC 42 contain capacitors C3 and C4 (as in FIG. 3) but also, resistors R5 and R6.

The embodiment as presented in FIG. 4 operates in the similar manner as the embodiment of FIG. 3, however, the feed-forward signal path is processed by a resistive gain amplifier i.e., the feed-forward active component 42. In this arrangement, C1, C2 and C7 are optional and have the effect of limiting the noise bandwidth of R1, R2 and R7. Therefore, to achieve a flat frequency response the following must be true: R1C1=R2C2=R7C7. In difference to FIG. 3, in this embodiment both the input ADC channel 432 and the feed-forward ADC channel 434 of the two-channel main ADC 42 should be sampled at the same time so that the Ve error terms in both channels have the same phase and the correct magnitude.

Moreover, for best distortion cancelling, the sampling bandwidth of capacitors C4 and C3 should be matched, such that C3R5=C4R6.

Additionally, FIG. 4 incorporates an accompanying timing diagram. The timing diagram shows the relative operation and timings of different aspects of the ADC driver circuit 40. In this scenario, when S3-S6 are closed the signals are acquired on the input ADC channel 432 and a feed-forward ADC channel 434 of the two-channel main ADC 43. After S3-S6 open, signals are captured on C3 and C4 the two-channel main ADC 43 facilitates the conversion of the acquired signals with the charges on C3 and C4 combined. For this example, it should be noted that as the sampling of the signals on C3 and C4 are best performed simultaneously, the single switch S5 can be used to sample the signals on both C3 and C4 with the right-hand side nodes of resistors R5 and R6 merged as shown by the dotted line.

Figure 5:
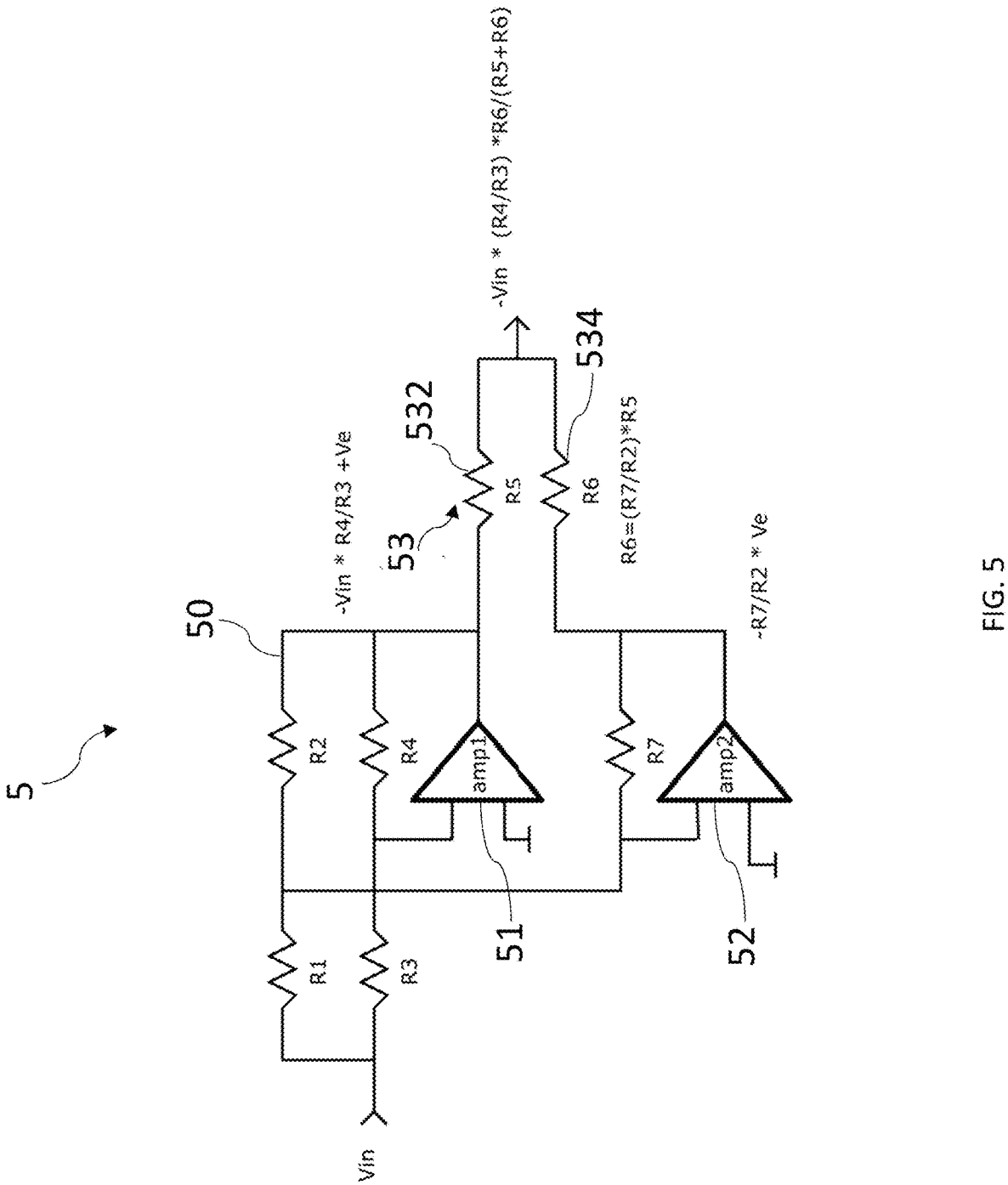
FIG. 5 shows a schematic diagram of a circuit with resistive error cancellation, in accordance with a further embodiment of the present disclosure.

FIG. 5 shows a schematic diagram of an ADC driver circuit with resistive error cancellation, in accordance with a further embodiment of the present disclosure. FIG. 5 shows an ADC driver circuit 5 comprising an input resistor network 50, an input amplifier 51, a feed-forward active component 52, an output resistor network 53. The output resistor network 53 comprises an input signal resistor 532 and a feed-forward signal resistor 534. The input signal resistor 532 is similar to the input ADC channel 432 of FIG. 4 and the feed-forward signal resistor 534 is similar to the feed-forward ADC channel 434 of the FIG. 4. In FIGS. 5, R3 and R4 of the input resistor network 50, the input amplifier 51 and the input signal resistor 532 of the output resistor network 53 form the input signal path. R1 and R2 of the input resistor network 50, the feed-forward active component 52 and the feed-forward signal resistor 534 of the output resistor network 53 form the feed-forward signal path.

The drive circuit arrangement 5 of FIG. 5 shares likenesses with the drive circuit arrangement 4 of FIG. 4, in that it comprises of two operational amplifiers 51 and 52, an input resistor network 50 and error cancellation circuitry 53.

Operationally, the ADC drive circuit 5 is arranged such that the error voltage, Ve, introduced by the input amplifier 51, is present in both the input signal path and the feed-forward signal path. The input resistor network 50 sets the gain of the input amplifier 51 but also ensures that the error voltage, Ve, is present in both the input signal path and the feed-forward signal path. Thus, the input signal (including the error voltage, Ve) and the error signal representative of the error voltage, Ve, are added resistively by the error cancellation circuitry 53. The input signal feeds into the input signal resistor 532 and the error signal representation feeds into the feed-forward signal resistor 534.

The output of the input signal amplifier 51 is ((-Vin*(R4/R3))+Ve) and the output from the feed-forward amplifier 52 or the feed-forward active component 52 is ((-R7/R2)*Vc). Therefore, if the input signal resistor 532 (also labelled R5) and the feed-forward signal resistor 534 (also labelled R6) are correctly scaled then the error voltage will be cancelled from the error signal when the input signal and the feed-forward signal are combined. For the correct scaling, the following should be true: R6=(R7/R2)*R5.

In a further embodiment of the present disclosure, the idea is to measure the virtual ground of the FDA and digitize it with high bandwidth and high precision. The virtual ground of the FDA contains much of the information about the nonlinearity at its output. During operation we keep the bandwidth of the feedback network as high as possible so that the phase shift between the output of the FDA and its virtual ground is sufficiently small in the distortion bandwidth of interest. The feedback network can usually be set up as an all-pass filter by using a capacitor in parallel with the feedback resistor to compensate for the capacitor at the amplifier input.

The output of the FDA and the virtual ground are both sampled at the same time. In a further embodiment, the measurement of the FDA output is fed to one ADC and the measurement of the error is fed forward to another ADC. These results are digitally combined with the appropriate scaling to cancel the errors in the FDA. In another embodiment, the measured errors in the virtual ground could be cancelled in analog and a single ADC could be used to digitize the resulting analog voltage.

It is important to make sure that the measurement path doesn't add errors of its own (or adds very small errors of its own). It would be preferable to buffer the virtual ground before providing the voltage to the ADC so that the ADC itself doesn't provide a capacitive load to the virtual ground.

One of the shortcomings of this scheme is that any current that enters the FDA amplifier from the virtual ground doesn't necessarily cause the virtual ground to move, or isn't "visible" at the virtual ground. That current flows through the feedback resistor and affects the FDA output, but not the virtual ground. This current could be due to nonlinear capacitance at the gate, for example. To counteract that issue, we can use another resistor divider leg between the input and the output of the FDA. This would provide the truest measurement of the errors from the FDA to within the matching limits between various resistors (pretty good with TFRs).

In a further embodiment of the present disclosure, the circuit could utilise filtering capacitors in the sense path resistor divider to filter the noise of the resistors. In this arrangement, any distortion at the output of the FDA is measured, including the input nonlinear currents.

Therefore, the noise at the output of the FDA goes through the low pass filter into the top ADC. This thermal noise voltage is also measured by the sense path. If the sense buffer has more bandwidth than the FDA low pass filter, and there is an additional filter in the sense path to match the noise filtering in the main path, then the bottom ADC will contain the noise of the FDA (including the noise from the resistors around it, but not the noise from the sense path resistors). This matched filtering between the main and sense paths allows for cancellation of the FDA noise. This means that the filter bandwidths can be opened up to what the sense buffers allow, improving the distortion due to nonlinear sampling glitches from the ADC, but without impacting the noise performance. This means that the resistors around the FDA can now be large, since the noise is no longer of concern. Only the sense path resistor noise is important.

One of the big advantages of the aforementioned embodiment of the present disclosure, is that high AC and DC accuracy is demanded from an element that deals with very small signals. Typically, the virtual ground differential voltage swing is ~10 mV or less.

It is worth noting that the sense buffer output capacitors are predominantly seeing a large common mode signal and a small differential signal. Where it is possible to float the RHS of these capacitors with the input common mode (for single-ended inputs), then the capacitors only draw differential charge, which is small. This allows us to increase the size of these capacitors without incurring distortion penalty from the sense buffers, thereby improving the noise performance of the overall system.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to."

The words "coupled" or "connected" or "tied", as generally used herein, refer to two or more elements or nodes that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list.

It will be understood that the above list is non-exhaustive, and that the method and system described herein is applicable to many technical problem domains to which machine learning models may be applied.

Various modifications, whether by addition, substitution, or deletion will be apparent to the intended reader to provide further embodiments of the present disclosure, any and all of which are intended to be encompassed by the appended claims.

What is claimed is:

1. A circuit comprising:
   an input amplifier arranged to receive an input signal, the input amplifier introducing into the input signal an error voltage;
   a feed-forward signal path being arranged such that it conveys an error signal representative of the error voltage; and
   error cancellation circuitry arranged to operate on the input signal and the error signal to cancel the error voltage from the input signal; and
   an impedance network coupled to an input and an output of the input amplifier where an output of the impedance network forms part of the feed-forward signal path, the impedance network comprising at least one potential divider.

2. The circuit of claim 1, wherein the input amplifier is arranged to receive an input signal to be digitized, and wherein the error cancellation is arranged such that the digitized input signal has the error voltage cancelled therefrom.

3. The circuit of claim 1, wherein the feed-forward signal path comprises at least one feed-forward active component.

4. The circuit of claim 3, wherein the at least one feed-forward active component is an amplifier.

5. The circuit of claim 1, wherein the input amplifier is further arranged such that the input signal including the error voltage is fed to a main analog-to-digital converter (ADC) for digitization.

6. The circuit of claim 1, wherein the feed-forward signal path comprises a feed-forward ADC channel.

7. The circuit of claim 6, wherein the error cancellation circuitry operates on the input signal that includes the error voltage on a main ADC channel and an error signal on a feed-forward ADC channel and further arranged to separately digitize:
   (i) the input signal via a main ADC; and
   (ii) the error signal via a feed-forward ADC; and
   combines a digital representation of the error signal from the feed-forward ADC with a digital representation of the input signal from the main ADC, for use in cancelling the error voltage contained therein.

8. The circuit of claim 1, wherein a multiplier is positioned in the feed-forward signal path, the multiplier being arranged to scale and/or invert the signal from an ADC, prior to being applied to the error cancellation circuitry; and/or
   a multiplier is positioned on the output of the main ADC the multiplier being arranged to scale and/or invert the output from the main ADC, prior to being applied to the error cancellation circuitry.

9. The circuit of claim 1, wherein the error cancellation circuitry operates on the input signal on a main ADC channel and an error signal on a feed-forward ADC channel, the main ADC channel and the feed-forward ADC channel being channels of a two channel main ADC, the two channel main ADC digitizes a combined input signal and error signal to produce a single digitized output such that the digitized output has the error voltage cancelled therefrom.

10. The circuit of claim 9, wherein the two channel main ADC comprises a first channel and a second channel, the first channel comprising: a first switch and a first capacitor in series, the second channel comprising: a second switch and a second capacitor in series, wherein the first switch of the first channel of the two channel main ADC is used to sample and hold the input signal including the error voltage on the first capacitor, the second switch is used to sample and hold the error signal on the second capacitor.

11. The circuit of claim 10, wherein the first channel and second channel of the two channel main ADC are arranged such that when the input signal including the error Ve is acquired on the first capacitor and the error signal is acquired on the second capacitor the two channel main ADC digitizes the combined input signal and the error signal to produce the digitized output; and wherein the capacitance of the first capacitor in the first channel and the capacitance of the second capacitor in the second channel are scaled to cancel the error voltage in the two channel main ADC.

12. The circuit of claim 1, wherein the feed-forward signal path further comprises a third capacitor, the third capacitor being arranged to sample the error signal prior to gain in the feed-forward signal path.

13. The circuit of claim 1, wherein the drive circuit is arranged such that a bandwidth of the drive circuit first sampling the input signal including the error Ve and a bandwidth of the drive circuit first sampling the error signal are substantially matched and the first sampling of the input signal including the error Ve and the first sampling of the error signal occur at substantially the same time.

14. The circuit of claim 1, wherein the error cancellation circuitry comprises a first resistor in an input signal path and a second resistor in an error signal path, the first resistor and the second resistor both being connected to an output node and being arranged such that the error voltage is cancelled from the input signal by the overall ratio of the network resistances at the output node.

15. The circuit of claim 1, wherein the at least one potential divider comprises a first potential divider connected between the output of the input amplifier and an input node and having an output connected to the input of the input amplifier, and a second potential divider connected between the output of the input amplifier and the input node and having an output connected to an input of the feed-forward signal path.

16. A circuit for a two channel analog-to-digital converter (ADC), the circuit comprising:

an input amplifier arranged to receive an input signal to be digitized by a main ADC channel, the input amplifier introducing into the input signal an error voltage, the input signal including the error voltage being input into the main ADC channel;

a feed-forward signal path comprising a feed-forward analog-to-digital converter (ADC) channel that receives an error signal representative of the error voltage;

error cancellation circuitry arranged to operate on the signals on the main ADC channel and the feed-forward ADC channel, the main ADC channel and the feed-forward ADC channel being channels of a two channel ADC, the ADC digitizes the combined input signal and the error signal to produce a digitized output such that the digitized output has the error voltage cancelled therefrom; and an impedance network coupled to an input and an output of the input amplifier where an output of the impedance network forms part of the feed-forward signal path, the impedance network comprising at least one potential divider.

17. The circuit of claim 16, the two channel ADC channel comprising: a first switch and a first capacitor arranged in series, the feed-forward ADC channel comprising: a second capacitor arranged in series, wherein the first switch of the first channel of the two channel ADC is used to sample and hold the input signal on the first capacitor, the error signal is sampled and held on the second capacitor.

18. The circuit of claim 17, the drive circuit being arranged such that the error signal is acquired on the feed-forward ADC channel during a second time period; and such that the two channel ADC digitizes the combined input signal including the error voltage and the error signal to produce a digitized output during a third time period, wherein the third time period occurs after the second time period and the second time period occurs after the first time period.

19. The circuit of claim 16, wherein the at least one potential divider comprises a first potential divider connected between the output of the input amplifier and an input node and having an output connected to the input of the input amplifier, and a second potential divider connected between the output of the input amplifier and the input node and having an output connected to an input of the feed-forward signal path.

20. A circuit for a main analog-to-digital converter (ADC), the circuit comprising:

an input amplifier arranged to receive an input signal to be digitized by a main ADC channel, the input amplifier introducing into the input signal an error voltage, the input signal including the error voltage being input into the main ADC channel for digitization;

a feed-forward signal path comprising a feed-forward analog-to-digital converter (ADC) channel that receives an error signal representative of the error voltage for digitization;

error cancellation circuitry arranged to operate on the signals on the main ADC channel and the feed-forward ADC channel, and further arranged to separately digitize:

(i) the input signal via a main ADC; and (ii) the error signal via a feed-forward ADC; and combine a digital representation of the error signal with a digital representation of the input signal to cancel the error Voltage contained therein; and an impedance network coupled to an input and an output of the input amplifier where an output of the impedance network forms part of the feed-forward signal path, the impedance network comprising at least one potential divider.

21. The circuit of claim 20, wherein the drive circuit is arranged such that the input signal is acquired by the main ADC and the error signal is acquired on a capacitor arranged in the feed-forward signal path during a first time period; and wherein during a second time period, the error signal is acquired by the feed-forward ADC, wherein the second time period occurs after the first sample time period.

22. The circuit of claim 20, wherein the at least one potential divider comprises a first potential divider connected between the output of the input amplifier and an input node and having an output connected to the input of the input amplifier, and a second potential divider connected between the output of the input amplifier and the input node and having an output connected to an input of the feed-forward signal path.

\* \* \* \* \*